(12) United States Patent  
Sträußnigg

(10) Patent No.: US 9,172,494 B2  
(45) Date of Patent: Oct. 27, 2015

(54) MODULATOR DEVICE

(71) Applicant: Infineon Technologies Austria AG, Villach (AT)

(72) Inventor: Dietmar Sträußnigg, Villach (AT)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 14/149,657

(22) Filed: Jan. 7, 2014

(65) Prior Publication Data

US 2015/0195059 A1 Jul. 9, 2015

(51) Int. Cl.  
*H04L 27/32* (2006.01)  
*H04L 1/00* (2006.01)  
*H04B 1/04* (2006.01)

(52) U.S. Cl.  
CPC ............ *H04L 1/0003* (2013.01); *H04B 1/0483* (2013.01)

(58) Field of Classification Search  
CPC ..... H04L 27/0008; H04L 27/02; H04L 27/04; H04L 27/10; H04L 27/12; H04L 27/18; H04L 27/20  
USPC .......... 375/268, 269, 271, 272, 279, 300, 303  
See application file for complete search history.

(56) References Cited

U.S. PATENT DOCUMENTS

| 5,291,516 | A | * | 3/1994 | Dixon et al. | 375/131 |
| 5,577,087 | A | * | 11/1996 | Furuya | 375/377 |
| 5,887,010 | A | * | 3/1999 | Arai | 372/38.04 |
| 6,608,827 | B1 | * | 8/2003 | Austin | 370/348 |
| 6,785,564 | B1 | * | 8/2004 | Quigley et al. | 455/574 |
| 6,906,999 | B1 | * | 6/2005 | Schulz | 370/218 |
| 2013/0058504 | A1 | | 3/2013 | Wu | |

* cited by examiner

*Primary Examiner* — Kevin Kim  
(74) *Attorney, Agent, or Firm* — Shumaker & Sieffert, P.A.

(57) ABSTRACT

Devices, chips and methods are provided which involve the use of either a first modulator path or a second modulator path depending on a level of a signal to be processed.

17 Claims, 5 Drawing Sheets

MODULATOR DEVICE

TECHNICAL FIELD

The present application relates to devices and chips comprising modulators and corresponding methods for modulating a signal.

BACKGROUND

In various applications, signals are modulated to change the signals in a desired manner. For example, in some applications an analog signal may be converted to a digital signal having a certain bit width, for example an 8 bit signal, a 10 bit signal or a 20 bit signal, and subsequently a modulator may be used to convert the digital signal to a bitstream, i.e. a series of signal values indicating either a logic 1 or a logic 0. For example, digital modulators somewhat resembling a sigma-delta-converter may be used for such a conversion.

For instance, in case an input signal has a high dynamic range, which may be for example the case in some applications where an original analog signal is generated by a microphone, a higher order modulator may be needed to obtain a desired signal to noise ratio than for applications with lower dynamic range. For example, for a standard dynamic range a fourth order modulator may be used, and for a higher dynamic range a fifth or higher order modulator may be used to generate the bitstream mentioned above.

However, in this case also subsequent circuitry utilizing the bitstream, for example a CODEC (coder/decoder), may have to be adapted to the order of the modulator used. In some cases, this is undesirable, and in some environments it would be more desirable to be able to use the same circuitry for processing the modulator output like a bitstream regardless of whether a signal with high dynamic range or a signal with low dynamic range is to be processed.

DETAILED DESCRIPTION

Figure 1:
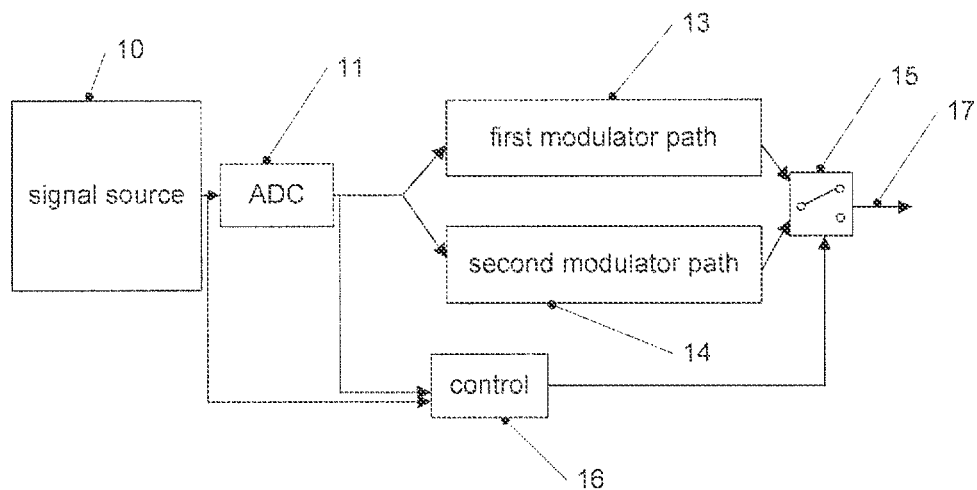
FIG. 1 is a schematic block diagram illustrating an embodiment of a modulator device.

In the following, various embodiments will be described with reference to the attached drawings. It is to be noted that the embodiments described herein and illustrated in the drawings serve only as illustrative examples and are not to be construed as limiting the scope of the present application. For example, while embodiments may be described as having a plurality of elements or features, in other embodiments some of these elements or features may be omitted, or may be replaced by alternative elements or features. In yet other embodiments, additional elements or features may be provided. Also, elements or features from different embodiments may be combined with each other to form additional embodiments unless specifically noted otherwise.

Moreover, connections or couplings between various elements shown in the drawings may be direct connections or couplings, i.e. connections or couplings without intervening elements, or indirect connections or couplings, i.e. connections or couplings with one or more intervening elements, which are not necessarily in the drawings, as long as these intervening elements do not change the general function of the connection or coupling, for example to transmit a certain kind of signal or information. Connections or couplings may be implemented in various manners, for example as wire-based connections, wireless connections, optical connections etc.

Various embodiments described in the following employ a modulator. A modulator as described herein may refer to a component which receives an input signal and outputs an output signal based on the input signal, wherein information contained in the input signal may be recovered from the output signal. For example, in communication applications modulators are known which modulate a carrier wave based on an input signal which may be a data signal. In this case, information contained in the input signal may be recovered by a corresponding demodulation of the modulated carrier wave. In other cases, for example in some embodiments described in the following, modulators may output a bitstream, e.g. a series of values of logic 1 and logic 0, based on an input signal. In such a case, the bitstream is modulated, i.e. the values of its bits are determined, depending on the input signal. A signal value of the input signal may be recovered from the bitstream. One example for such modulators are sigma-delta modulators which receive an analog input signal and output a bitstream representing a signal level (e.g. voltage level) of the analog input signal. In some embodiments, digital modulators using similar principles of operation as sigma-delta modulators may for example be used to convert a multi-bit signal, for example a stream of n-bit samples with n>1, to a bitstream. Digital values of the n-bit samples may be recovered from the bitstream. Digital modulators of this kind may also be referred to as digital converters, as they convert digital data from one format (e.g. n-bit samples with n>1) into another format (bitstream).

Modulators of various orders may be used. The order of the modulator used may for example depend on requirements regarding signal to noise ratio (SNR) or signal to noise plus distortion ratio (SNDR). Furthermore, the order of the modulator used may depend on a dynamic range of an input signal, for example a bit width of the input signal.

Turning now to the figures, in FIG. 1 a device according to an embodiment is illustrated. The device of FIG. 1 receives an analog signal from a signal source 10, which may be part of the device or external to the device. Signal source 10 may for example be a microphone which converts sounds to aria-r: log electrical signals. However, other signal sources may be used as well. The analog signals in the embodiment of FIG. 1 are fed to an analog-to-digital converter 11 which converts the analog signals to digital signals, for example n bit signals, n being greater than 1. For example, the digital samples may be a stream of n-bit samples, e.g. 22-bit samples, 20-bit samples, 8-bit samples etc. Further conventional elements for processing the analog signals may be present. For example, the analog signal may be amplified and/or filtered prior to being converted by analog-to-digital converter 11.

In other embodiments, analog-to-digital converter 11 may be omitted, for example in cases where signal source 10 generates digital signals.

In the embodiment of FIG. 1, the output signal of analog-to-digital converter 11 is fed to a first modulator path 13 comprising a first modulator and to a second modulator path 14 comprising a second modulator. Therefore, the signal output by analog-to-digital converter 11 forms an input signal for first modulator path. 13 and second modulator path 14. In other embodiments, prior to being fed to first modulator path 13 and second modulator path 14 the signal may be subjected to digital processing like filtering, and the thus processed signal the forms the input signal for first modulator path 13 and second modulator path 14. A selector 15 either couples first modulator path 13 or second modulator path 14 to an output 17, such that either first modulator path 13 or second modulator path 14 is used outputting a signal to output 17.

Selector 15 is controlled by a controller 16. In the embodiment of FIG. 1, controller 16 may control selector 15 corresponding to a signal magnitude of the input signal and control selector 15 accordingly. A signal magnitude as described herein may refer to a signal level of an analog signal (e.g. voltage level, current level) or a signal value of a digital signal (e.g. a value between 0 and $2^n-1$ for an n bit signal). In the embodiment of FIG. 1, for example the signal value of the digital signal output from ADC 11 corresponds to the signal level of the analog signal output by signal source 10.

In an embodiment, controller 16 may for example receive the output signal from analog-to-digital converter 11 and e.g. compare the output signal to a threshold value and compare selector 15 based on the comparison. In other cases, alternatively or additionally controller 16 may receive the signal output from signal source 10 or any other signal from which the signal magnitude of the input signal may be derived.

For example, for signals having a signal magnitude smaller than a threshold, first modulator path 13 may be selected by controller 16, and for signals having a signal magnitude above the threshold, second modulator path. 14 may be selected. In this way, for example first modulator path. 13, for example a modulator thereof, may be optimized for smaller signal magnitudes, while second modulator path 14, for example a modulator thereof, may be optimized for larger signal magnitudes. For example, for smaller signal magnitudes a high signal-to-noise ratio (SNR) or a high signal-to-noise plus distortion ratio (SNDR) may be more important for some applications than for signals with higher signal level, and the modulators or modulator paths may be designed accordingly.

In some embodiments, in this way a high dynamic range of input signals may be processed without a need for increasing an order or modulators used in first modulator path 13 and second modulator path 14 compared to a case where only signals with a low dynamic range are processed. In some embodiments, a modulator of first, modulator path 13 may have the same order as a modulator used in second modulator path 14.

It should be noted that while a selectors 15 is shown in FIG. 1 coupled between first and second modulator paths 13,14 and output 17, in other embodiments other arrangements for selecting one of the modulator paths may be provided. For example, in an embodiment an additional selector may be provided coupled between ADC 11 and first and second modulator paths 13,14 to selectively feed the output signal of ADC 11 only to the selected modulator path 13 or 14.

Figure 2:
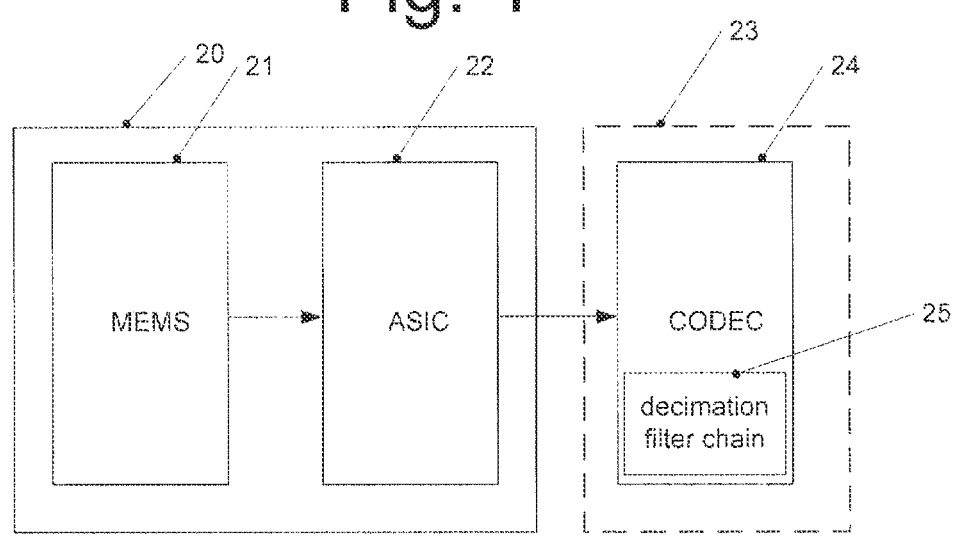
FIG. 2 is a schematic block diagram illustrating an environment where a modulator device may be employed, according to an embodiment.

FIG. 2 illustrates a device 20 according to an embodiment which is an example for an environment where for example the device of FIG. 1 or other devices described later on may be employed. It should be noted that the device 20 serves only as an example, and techniques described herein may also be employed in other embodiments.

Device 20 comprises micro-electromechanical system (MEMS) 21 acting as a signal source providing an analog signal. For example, MEMS 21 may be designed as a microphone comprising a membrane etched or otherwise provided on or in a semiconductor wafer like a silicon wafer using conventional techniques. In other embodiments, other kinds of signal sources may be used. In some embodiments, MEMS 21 may be a microphone intended to be used to capture signals, e.g. speech signals or other sounds, with a comparatively high dynamic range.

Device 20 further comprises an application specific integrated circuit (ASIC) 22 which receives signals output by MEMS 21. ASIC 22 in some embodiments may be integrated on the same chip with MEMS 21 such that in some embodiments device 20 may be provided on a single chip. In other embodiments, ASIC 22 may be provided on a separate chip. ASIC 22 may for example comprise a first modulator path and a second modulator path as well as selection circuitry which selects either the first modulator path or the second modulator path for processing of signals from MEMS 21, for example depending on a signal level of signals output from MEMS 21. Furthermore, ASIC 22 may in some embodiments comprise an analog-to-digital converter (ADC) which is coupled between MEMS 21 and the first and second modulator paths, for example as explained with reference to FIG. 1. In some embodiments, first modulator path and second modulator path of ASIC 22 may output a bitstream. In some embodiments, the first modulator path and the second modulator path may comprise modulators of the same order.

The order of the modulators in some embodiments may be the same order which would be chosen in case only signals with a low dynamic range have to be processed.

Signals output from ASIC 22, for example a bitstream as mentioned above, may be forwarded to a further device 23. Further device 23 may for example comprise a CODEC 24 (coder/decoder) or any other circuitry for processing the signals received from ASIC 22 of device 20. CODEC 24 may for example be a speech codec used for further processing speech signals captured by MEMS 21 and processed bay ASIC 22. Such a further processing may for example involve a compression of the speech data represented by the output signals of ASIC 22. Furthermore, CODEC 24 may comprise a decimation filter chain 25 for decimating the received signal. CODEC 24, for example decimation filter chain 25, may be adapted to the order of modulators used in ASIC 22.

In case a single modulator path were used in ASIC 22, the order of the modulator would have to be adapted to the dynamic range of the output signal of MEMS 21. For example, for some applications, a $4^{th}$ order modulator may be sufficient to provide a desired SNR or SNDR. On the other hand for some applications a signals output by MEMS 21 may have a higher dynamic range, requiring for example a $5^{th}$ order modulator to provide a desired SNR or SNDR and stable operation.

In some embodiments, by using two modulator paths in ASIC 22 the same order of modulators may be used for high dynamic range as would be used for signal sources having a lower dynamic range, a same CODEC may be used for different applications. This may in particular be useful when device 20 and device 23 are provided by different manufacturers, as for example existing CODECs or other circuits designed for lower dynamic range may used without modifications also for higher dynamic range. It should be noted that in other embodiments, further elements like CODEC 24 may be provided in device 20 and/or integrated with ASIC 22 or MEMS 21 on a same chip. In yet other embodiments, instead of ASIC 22 other kinds of circuitry may be used. In still other embodiments, e.g. ASIC 22 may be integrated together with CODEC 24, and MEMS 21 or any other signal source may be provided separately. Therefore, the components shown in FIG. 2 and their partitioning in devices 20, 23 are merely an example, and other configurations are equally possible.

Figure 3:
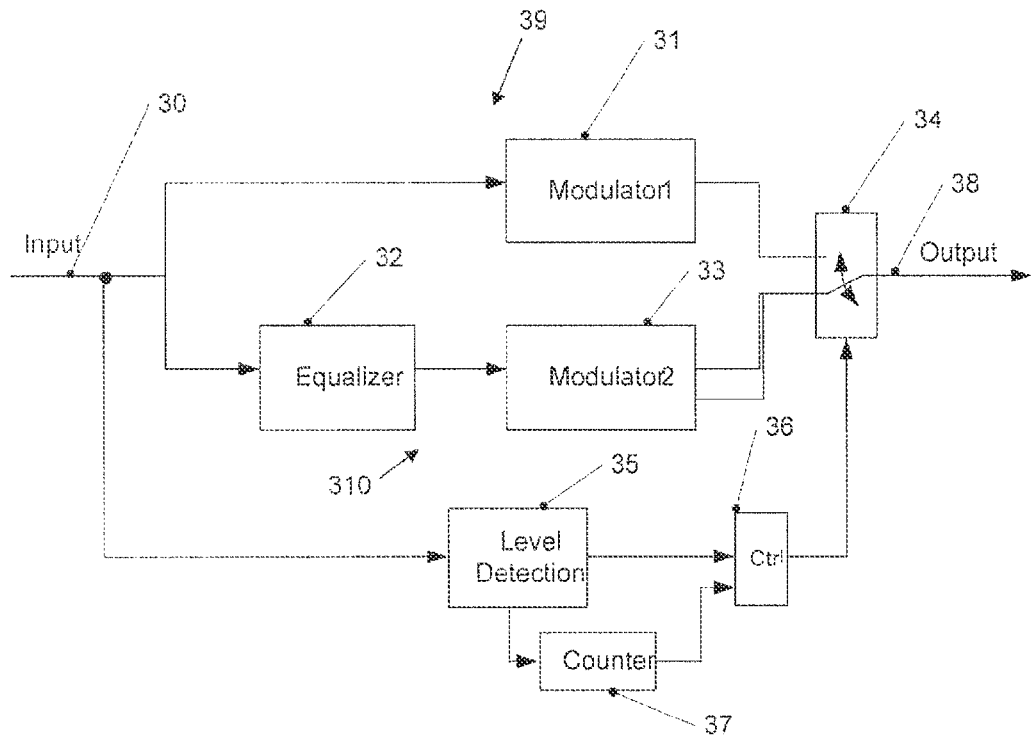
FIG. 3 is a block diagram illustrating a modulator device according to an embodiment.

In FIG. 3, a device according to a further embodiment is shown. The device of FIG. 3 may for example be used as part of ASIC 22 of FIG. 2, but may also be used in other circumstances where an input signal, for example a digital input signal, is to be processed.

In the embodiment of FIG. 3, an input signal is received at an input 30. The input signal may be an n-bit digital signal, e.g. a signal being a stream of n bit samples for example 8 bit samples, 10 bit samples, 20 bit samples, 22 bit samples etc. The input signal in embodiments is not limited to any particular bit width of the samples.

Input 30 is coupled with an input of a first modulator 31 and with an input of an equalizer 32. An output of equalizer 32 is coupled with an input of a second modulator 33. First modulator 21 forms a first modulator path 39, and equalizer 32 and second modulator 33 form a second modulator path 310. First modulator 31 and second modulator 33 may have a same order, for example first order, second order, third order or fourth order, or higher, but are not limited thereto. Using first modulator 31 or second modulator 33, in some embodiments the input signal having a width of n bits, n>1, may be converted to a bitstream, e.g. a stream of values of logic 0 or 1. An output of first modulator 31 is coupled with a first input of a selector 34, and an output of second modulator 32 is coupled with a second input of selector 34. Selector 34 selectively couples either its first input or its second input with an output 38.

In an embodiment, modulator 31 is used for processing input signals with a comparatively lower signal magnitude, for example n bit samples representing signal values below a predetermined threshold, while second modulator 33 may be used for processing signals with a higher signal magnitude, for example n bit samples representing signal values at or above the predetermined threshold. To perform the appropriate selection with selector 34, a magnitude detection 35 is provided which for example compares the signal values represented by n-bit samples to a predetermined threshold and outputs a corresponding control signal to selector 34.

Optionally, a counter 37 is provided which counts a number of input signal samples after an output of magnitude detection 35 indicates that the input signal has exceeded the threshold in case it was below the threshold previously or indicates that the input signal is below the threshold when the input signal was above the threshold previously. In other words, a number of samples corresponding to a time delay is counted when a condition indicating that a switching between modulator paths should be performed. In an embodiment, only if the signal magnitude is stable above or below the threshold for a predetermined number of samples corresponding to a predetermined time, counter 37 enables switching of selector 34 by controlling a controller 36 accordingly. In other words, controller 36 receives the control signal from magnitude detection 35, but enables a forwarding of this control signal to selector 34 only after the signal magnitude has been stable below or above the threshold for a predetermined number of counts of counter 37. In this way, for example switching due to transient effects or the like may be prevented in some embodiments. In other embodiments, only a magnitude detection may be provided, and a delay mechanism like counter 37 may be omitted.

In some embodiments, modulators 31, 33 may have the same order, but differ for example in an amplification provided within a loop of the modulator, as will be explained below. For example, first modulator 31 used for input signals below the threshold may have a higher amplification associated with a loop filter than second modulator 33. In the digital domain, as will be explained below an amplification may correspond to a simple multiplication. In some embodiments, changing the amplification in this way may change the signal transfer function of the modulator. To compensate this, equalizer 32 may be provided in some embodiments. By using equalizer 32, a transfer function of modulator 31, i.e. the first modulator path may be at least approximately the same as a transfer function of equalizer 32 and second modulator 33 combined, i.e. the second modulator path. This will be explained using an example below.

Figure 4:
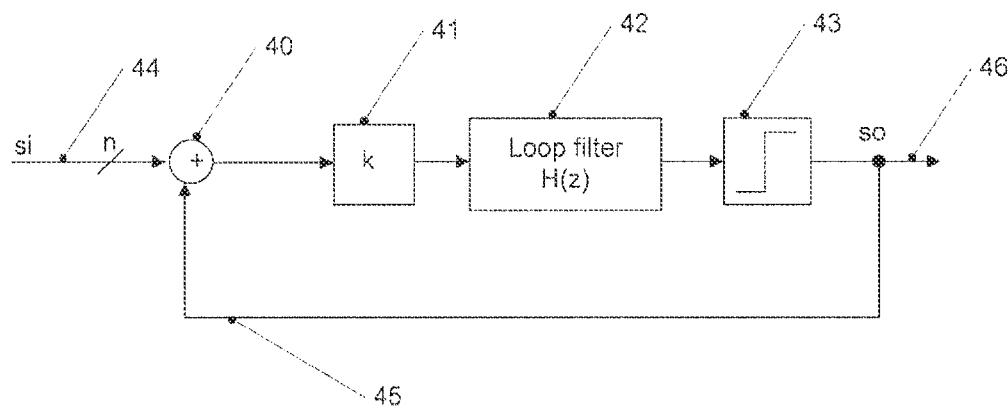
FIG. 4 is a block diagram illustrating a modulator usable in some embodiments.

To illustrate this, in FIG. 4 a simple example of a modulator is shown. The operation of the modulator of FIG. 4 resembles operation of a sigma-delta-analogto-digiti converter with the exception that it receives a digital signal, for example an n-bit signal with n>1, and not an analog signal as would be the case for a sigma-delta converter, and that is has no digital-to-analog converter in a feedback path. In other words, the modulator of FIG. 4 corresponds to a purely digital version of a sigma-delta-modulator. As is the case for conventional sigma-delta-converters, the modulator shown in FIG. 4 may use oversampling, i.e. sample (process) an input signal like input signal si in FIG. 4 with a considerably higher sampling rate than the sampling rate of the input signal si. For example, an oversampling factor may be in a range from 50-150, for example around 80-90.

The modulator example of FIG. 4 receives an input signal si at an input 44. Input signal si in the example shown is a stream of n bit samples, n>1. Input signal si is fed to a positive input of a subtractor 40. Moreover, a 1 bit output signal so of the modulator of FIG. 4 is fed back to a negative input of subtractor 40 via a feedback path 45. Subtractor 40 subtracts the 1 bit signal so from the n bit signal si at the most significant bit (MSB) of the n bit signal si.

An output signal of subtractor 40 is multiplied by a factor of k in an amplification block 41 (in the digital domain, an amplification corresponds to a simple multiplication) and filtered by a loop filter 42. Loop filter 42 generally has a transfer function H(z). In embodiments, loop filter 42 may be a low pass filter of an order k. The order of loop filter 42 in the example modulator of FIG. 4 determines the order of the modulator. For example, by using a $4^{th}$ order low pass filter as loop filter 42 a $4^{th}$ order modulator would be implemented. While amplification block 41 and loop filter 42 are shown as separate blocks in FIG. 4, amplification block 41 associated with loop filter 42 may also be part of loop filter 42 in some embodiments. In other words, the separation of amplification block 41 and loop filter 42 in FIG. 4 is merely for ease of representation.

In an embodiment, k may be greater for a modulator like first modulator 31 in FIG. 3 which is used for signals having a comparatively lower signal magnitude, and k may be smaller for a modulator like second modulator 33 of FIG. 3 which is used for signals having a comparatively higher signal magnitude. In some embodiments, a higher value of k may lead to favorable properties with respect to SNR or SNDR, but may lead to an instable behavior at higher signal magnitudes. Therefore, by using a higher value of k for first modulator 31 of FIG. 3, for lower signal magnitudes favorable SNR or SNDR properties may be obtained. On the other hand by using a lower value of k for second modulator 33 of FIG. 3, stable operation at higher signal magnitudes may be achieved in some embodiments, while the requirements regarding SNR or SNDR may be more relaxed for higher signal magnitudes in some embodiments.

An output of loop filter 42 is fed to a quantisizer 43 which depending on the signal output from loop filter 42 outputs either a logic 1 or a logic 0 to an output 46 and therefore converts the n bit input signal si received at input 44 to output signal so which is a bitstream.

A signal transfer function (STF) of the modulator shown in FIG. 4 is equal to k·H(z)/(1+k·H(z)) and therefore depends on k. As already mentioned, in some applications it is desirable to have the same signal transfer function regardless of whether a signal has a comparatively small signal magnitude or a comparatively high signal magnitude in a device like the device of FIG. 1 or the device of FIG. 3. Therefore, an equalizer like equalizer 32 may be used to compensate for the change of signal transfer function. While in FIG. 3 an equalizer is shown only coupled to modulator 33, in other embodiments additionally or alternatively a further equalizer may be coupled to modulator 31. To implement equalizer 32 or similar equalizers in other embodiments, in embodiments like the embodiments described above where the modulators are fully digital the desired behavior of equalizer 32 may simply be input to a conventional design program. The desired behavior in the present example is to compensate for the different signal transfer functions of the modulators, which for the implementation example of FIG. 4 are given by k·H(z)/(1+k·H(z)) as mentioned above. Therefore, in such embodiments two modulator paths may be provided, which have the same signal transfer function, but which may have different SNR or SNDR properties and/or different stability behavior at higher signal magnitudes.

While in FIG. 1 a first modulator path and a second modulator path are shown, and in a similar manner in FIG. 3 a first modulator path comprising first modulator 31 and a second modulator path comprising equalizer 32 and second modulator 33 are shown, in other embodiments more than two modulator paths may be provided, which may be selected depending on a signal magnitude. In this respect, a "device comprising two modulator paths" or similar is to be interpreted as a device which has these two modulator paths, but which may, but need not, additionally have further modulator paths, for example a third modulator path, fourth modulator path etc. Like the first and second modulator paths depicted in FIG. 1, such additional modulator paths may each be selectable to modulate input signals with different signal magnitudes, based on comparison of the input signal to one or more thresholds. In some examples, such a plurality of modulator paths may each be configured to process a signal with a different amplification value (like amplification value k of FIG. 4) associated with a loop filter of the modulator.

Figure 5:
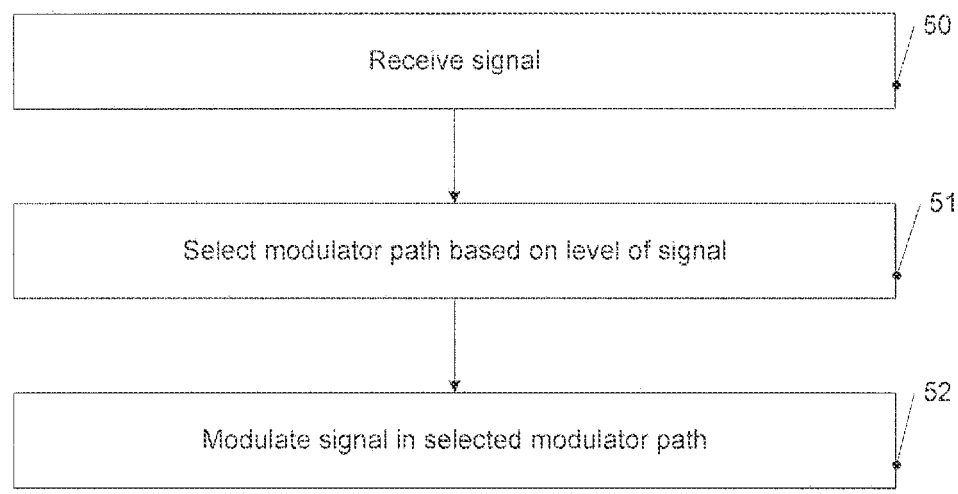
FIG. 5 is a flowchart illustrating a method according to an embodiment.

In FIG. 5, a flowchart illustrating a method according to an embodiment is shown. While the method is presented as a series of acts or events, the order in which these acts or events are presented is not to be construed as limiting. For example, certain events may be performed in a different order than shown or may be performed concurrently with each other. Moreover, the presented method may be performed repeatedly to continuously process signals.

At 50, a signal to be modulated is received, for example an n bit digital signal (n>1) obtained by an analog-to-digital conversion of an analog signal. The analog signal may for example be generated by a microphone or any other signal source. In other embodiments, the signal may be a digital signal received from a digital signal source.

At 51, a modulator path is selected based on one or more characteristics a of the signal received at 50, for example one a plurality of different modulator paths may be selected based on the one or more characteristics of the input signal. For example, the modulator path may be selected based on comparison of a signal magnitude of the input signal, e.g. a signal value in case of a digital input signal or an amplitude of the input signal in case of an analog input signal, to one or more thresholds. As one example, the threshold may be selected based on properties of the modulator paths. For example, a first one of the modulator paths may have a favorable SNR or SNDR behavior, but may be prone to instable behavior at higher signal magnitudes. A second one of the modulators paths may have higher stability at higher signal magnitudes, but be less favorable in terms of SNR or SNDR. In such an example, if the signal magnitude of the input signal is less that the threshold, then the first modulator path is selected. According to this example, if the signal magnitude of the input signal is greater than the threshold, the second modulator path is selected. The threshold may be chosen such that for signal magnitudes below the threshold, the first modulator path provides a stable operation. According to these examples, the first modulator path may have a lower amplification factor associated with a loop filter than the second modulator path.

At 52, the signal is modulated in the selected modulator path, for example converted to a bitstream.

The method of FIG. 5 may for example be implemented in any of the devices explained with reference to FIGS. 1 and 4, and modifications applicable to the devices may also be applicable to the method. However, use of the method of FIG. 5 is not restricted to the devices of FIGS. 1-4.

To illustrate the embodiments discussed above so far, FIG. 9 shows some schematic examples for signals in some embodiments. These examples were simplified to provide a clearer representation and understanding and are not to be construed as limiting. For examples, signals in various implementations and embodiments may have bitwidths, sampling rates, signal forms etc. different from the ones shown in FIG. 9.

Figure 9:
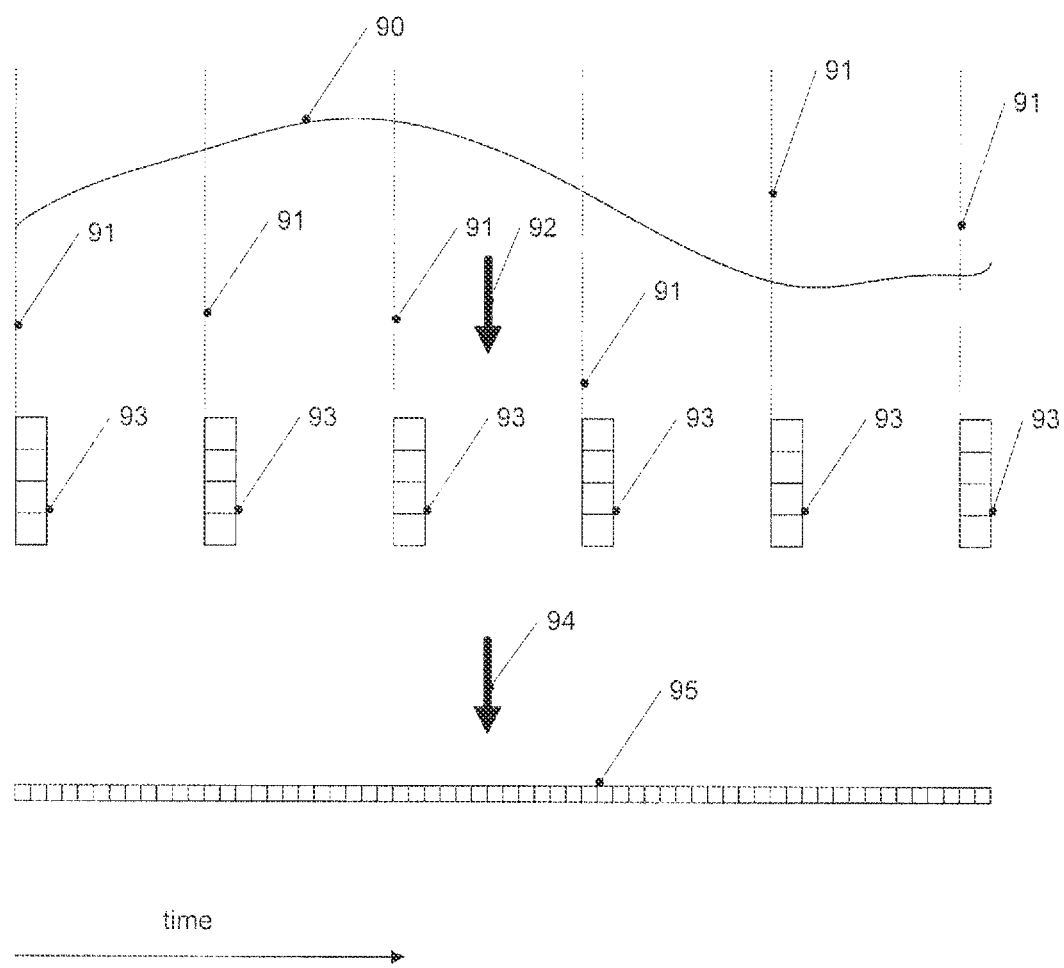
FIG. 9 shows examples for analog and digital signals to illustrate some embodiments.

A curve 90 in FIG. 9 represents a simple example for an analog signal as may for example be produced by signal source 10 of FIG. 1 or by MEMS 21 of FIG. 2. As indicated by an arrow 91, this analog signal 90 is sampled at a plurality of sampling points 91, for example by ADC 11 of FIG. 1, to form an n-bit digital signal comprising successive n-bit samples 93. In the simplified example of FIG. 9, each square may represent 1 bit, so n would be 4. However, as already explained any desired value of n may be used, for example in a range from 20 to 24 depending on a required resolution.

In the example of FIG. 9, the n-bit digital signal is then processed by a modulator like modulator 31 or modulator 33, which may be implemented like the modulator illustrated in FIG. 4 as indicated by an arrow 94. In some embodiments, this results in a bitstream 95, i.e. a series of single bits. As schematically indicated in FIG. 9 and as explained above, oversampling may be used by the modulator, such that a sampling rate of bitstream 95 may be considerably higher than a sampling rate of n-bit samples 93. For example, oversampling factors in a range of 80-90 may be used. In embodiments, bitstream 95 represents the values of n-bit samples 93. For example, higher values of n-bit samples 93 may lead to a higher number of bits with value "1" than bits with value "0" in bitstream 95, similar to the behavior of a conventional sigma-delta converter.

In other words, in some examples, modulators of a first modulator path like path 13 and of a second modulator path like path 14, e.g. modulators 31 and 32 may be configured to generate a bit stream based on a digital value output by aria-log to digital Converter (ADC) 11. For example, as illustrated in FIG. 9 ADC 11 may, based on an analog signal level at an input of ADC. 11, output a binary number that reflects a value of the analog input signal. Modulators like modulators 31 and 33 may each be configured to receive such a binary number from ADC 11, and generate a bit stream that represents a value of the received binary number based on a relative percentage of ones (1's) or a relative percentage of zeros (0's) in the bit stream. In this manner, modulators 31 and 33 may operate similarly to a sigma delta analog to digital converter in that modulators output a bit stream with a relative percentage of digital values that represent a received, input, with the difference that the input itself is digital as opposed to analog, which would be the case with a conventional sigma delta converter.

As one non-limiting example, assume that ADC 11 as illustrated in FIG. 9 outputs a four digit binary number that reflects a value from 0-15 (i.e., from 0000-1111). According to this non-limiting example, whichever of Modulator paths 13 and 14 (e.g. modulator 31 or 33) is selected by switch 15 (or 34) may output a bit stream with that represents the four digit binary number received from ADC 11. The bit stream may represent the received four digit binary number based on a relative number of ones (1's) and zeros (0's) in the bit stream. As one non-limiting example, where modulator 31 receives a four digit binary number (0000) that represents an value of zero, modulator 31 may output a binary bit stream including only binary values of zero (0), for example 000000000000000. The number of 15 bits in this example for a bitstream merely serves illustration purposes and may be significantly higher, depending on an oversampling used by a particular implementation. As another non-limiting example, if modulator 31 receives a four digit binary number (1111) that represents an analog value of 15 received by ADC 11, modulator 31 may output a binary bit stream that includes only binary values of one (1), for example 111111111111111. As still an other non-limiting example, if modulator 31 receives a four digit binary number that represents a value of 8 (1000), modulator may output a binary bit stream that includes 53.3% (8/15) binary values of one (1), and 46.7% (7/15) binary values of zero (0), for example 101010101010101, 111111110000000, 000000011111111, or any other binary bit stream that represents the digital value 8 based on a relative number of ones (1s) and zeros (0s) in the bit stream. As mentioned, the number of bits in the bitstream associated with a binary number output from ADC 11 may be different from the number of 15 used in this simple illustrative example, depending on an oversampling used.

The examples of a binary bit stream that may be generated by modulators like modulators 31 and 33 as described above are provided for explanatory purposes only and are intended to be non-limiting. For example, either modulators 31 and 33 may be configured to generate a bit stream based on received digital values of any length including a four digit binary value as described above, a five digit binary number, a 20 digit binary number, or binary number that includes any number of binary values. In addition, a bit stream generated by either of modulators 31 and 33 may output a bit stream that uses more, or less, than 15 binary values to represent a particular value based on a relative percentage of ones (1's) and zeros (0's) in the urn stream in the above example (e.g., 000000000000000, 111111111111111, 101010101010101, 111111110000000, 000000011111111). For example, a single received binary number with a value of 1 may be represented in a generated bit stream based on a relative percentage of 5 binary values (e.g., five consecutive 1's: 11111), 20 binary values (e.g., 20 consecutive 1's: 11111111111111111111), or any other number of binary values.

Figure 6:
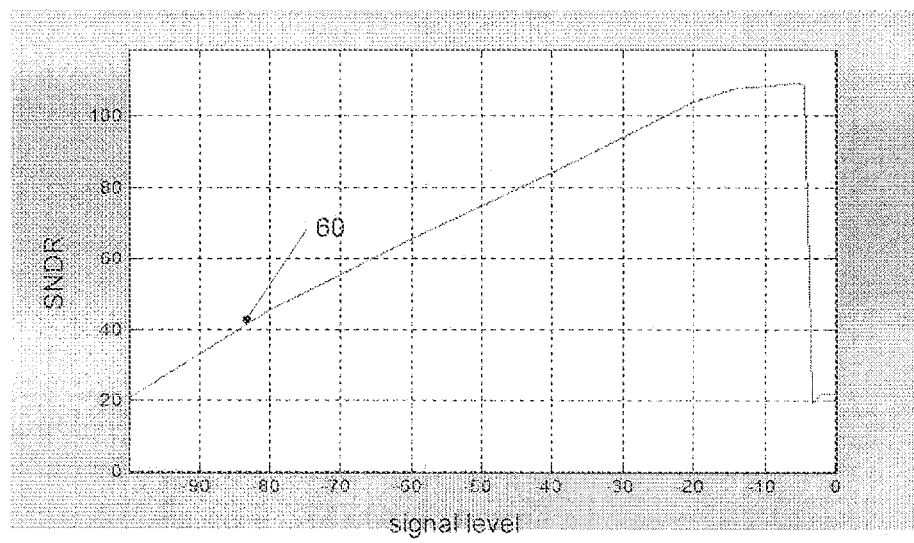
FIGS. 6-8 show simulation results illustrating operation of some embodiments.
Figure 7:
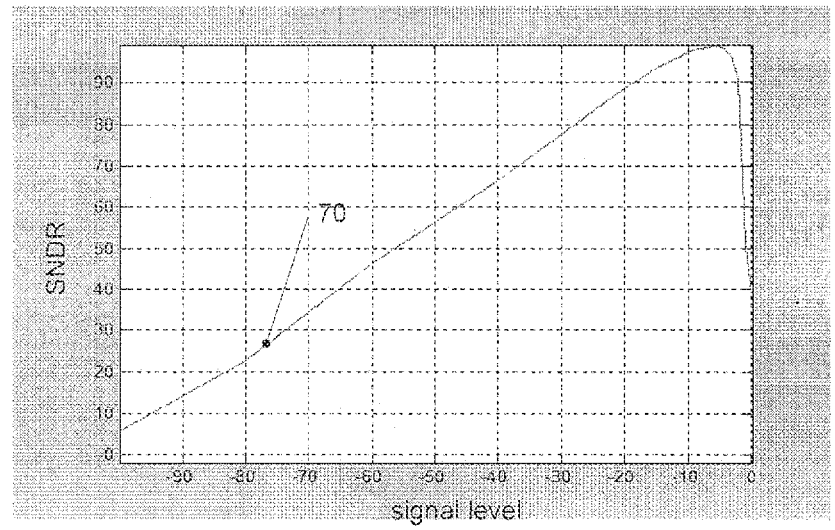
Figure 8:
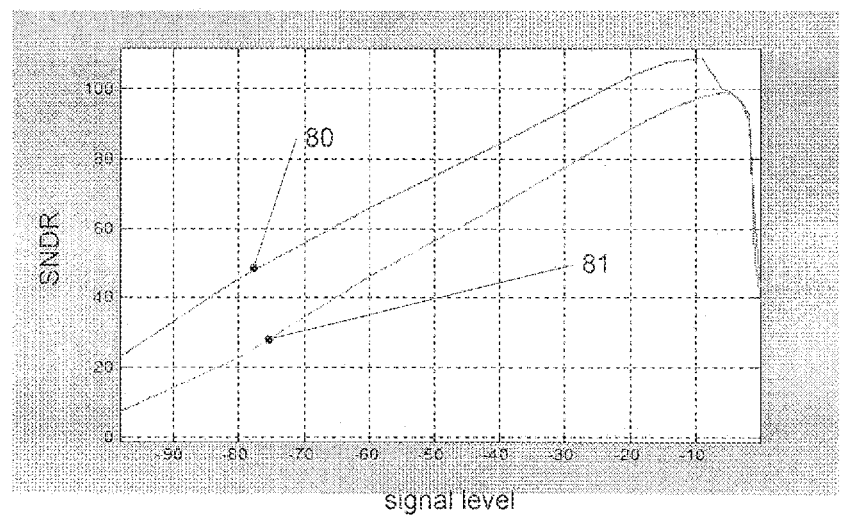

To illustrate the operation of some embodiments, in FIGS. 6-8 simulation results for a device essentially configured as the device of FIG. 3 are shown. These simulation results are only shown for illustration purposes, and other implementations and embodiments may exhibit a different behavior than shown in FIGS. 6-8.

In FIG. 6, a SNDR of a first modulator like first modulator 31 of FIG. 3 used for signals with comparatively lower signal magnitudes is shown as a curve 60 over a signal magnitude. Here, for example a gain k of the modulator or a loop filter thereof has a comparatively high value. Deterioration e.g. due to instable behavior of the modulator at higher signal magnitudes (between about −5 and 0) is visible. In FIG. 7, a corresponding curve 70 for a second modulator like second modulator 33 in FIG. 3 which is used for signals having a comparatively higher signal magnitude is shown. Such a modulator may for example use a lower value of k. Here, the SNDR is lower for lower signal magnitudes, but reaches higher values for higher signal magnitudes as no instable behavior occurs at higher signal magnitudes compared to curve 60 of FIG. 6. Curve 70 of FIG. 7 is shown again as curve 81 in FIG. 8. Additionally, the SNDR for the complete device is shown as a curve 80, as can be seen, by switching between modulator paths a high signal-to-noise ratio may be achieved. The switching in the example of FIG. 8 occurs at a signal magnitude of approximately −5 in this case, i.e. only for high signal magnitudes where the first modulator becomes unstable the second modulator is used. As can be seen from FIG. 8, with selectable modulator paths as explained e.g. with reference to FIG. 1 or FIG. 3 a high dynamic range of input, signals may be processed offering good SNDR in particular at lower signal magnitudes and stable operation over the complete dynamic range without the need to increase the order of the modulators used. This may ensure compatibility to existing equipment like CODECs and relax requirement for a decimation filter chain like decimation filter chain 25 of FIG. 2, which in turn may help to save costs.

It should be noted that the above embodiments and explanations serve only illustrative purposes and are not to be construed as limiting, as a plurality of variations and modifications are possible without departing from the scope of the present application.

What is claimed is:

1. A device, comprising:
 a signal input,
 a first modulator path, wherein said first modulator path comprises a first modulator,
 a second modulator path, wherein said second modulator path comprises a second modulator, and
 selection circuitry configured to select either the first modulator path or the second modulator path depending on a signal magnitude of an input signal at said signal input, wherein said first modulator and said second modulator are configured to receive a stream of n bit samples, n>1, and to output a bitstream.

2. The device of claim 1, wherein an order of said first modulator is equal to an order of said second modulator.

3. The device of claim 1, wherein said first modulator comprises a first loop filter and a first feedback loop, and wherein said second modulator comprises a second loop filter and a second feedback loop.

4. The device of claim 3, wherein an amplification factor associated with said first loop filter of said first modulator is greater than an amplification factor associated with said second loop filter of said second modulator,
  wherein said selection circuitry is configured to select said first modulator path if the input signal has a signal magnitude below a predetermined threshold and to select said second signal path if said signal magnitude is above said threshold.

5. The device of claim 1, wherein at least one modulation path of said first modulator path and said second modulator path comprises an equalizer.

6. The device of claim 1, wherein said input signal comprises a digital input signal, and wherein said signal magnitude comprises a value represented by said digital input signal.

7. The device of claim 1, wherein said selection circuitry comprises a delay circuit configured to delay switching between said first modulator path and said second modulator path until said input signal meets a condition for switching for a predetermined time.

8. The device of claim 1, further comprising an analog-to-digital converter configured to provide a digital signal to said signal input.

9. The device of claim 1, wherein said first modulator path and said second modulator path have a substantially similar signal transfer function.

10. A chip, comprising:
  a microelectromechanical system, and
  an integrated circuit, said application specific integrated circuit comprising:
    a first modulator path,
    a second modulator path, and
    a control circuit configured to select either said first modulator path or said second modulator path based on a signal magnitude of a signal output from said microelectromechanical system.

11. The chip of claim 10, wherein said microelectromechanical system comprises a microphone.

12. The chip of claim 10, wherein said integrated circuit further comprises an analog-to-digital converter coupled between said microelectromechanical system and said first and second modulator paths.

13. The chip of claim 10, wherein said controller comprises a signal magnitude detector and a counter.

14. A method, comprising:
  receiving an input signal,
  selecting a modulator path out of at least two modulator paths based on a level of the signal, and
  modulating the signal in the selected modulator path, wherein said modulating comprises converting said signal from an n-bit signal, n being greater than 1, to a bitstream.

15. The method of claim 14, further comprising equalizing said signal in said at least one of said modulator paths.

16. The method of claim 14, wherein selecting said modulator path comprises switching from one of said at least two modulator paths to another one of said at least two modulator paths only after said signal meets a condition associated with said another one of said at least two modulator paths for a predetermined time.

17. The method of claim 16,
  comprising counting of a number of samples of input signals and performing said switching only after said counting reads a number corresponding to said predetermined time.

\* \* \* \* \*